US006556092B1

(12) United States Patent
Ferrant

(10) Patent No.: US 6,556,092 B1
(45) Date of Patent: Apr. 29, 2003

(54) LOW CONSUMPTION OSCILLATOR

(75) Inventor: Richard Ferrant, Croppes (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/627,814

(22) Filed: Jul. 28, 2000

(30) Foreign Application Priority Data

Jul. 29, 1999 (FR) .......................................... 99 10043

(51) Int. Cl.⁷ ................................................ H03B 5/32
(52) U.S. Cl. ................... 331/116 FE; 331/109; 331/366; 331/158; 331/116 R
(58) Field of Search ....................... 331/116 FE, 116 R, 331/57, 174, 185, 186, 108 C, 36 C, 158, 109

(56) References Cited

U.S. PATENT DOCUMENTS

| 4,106,278 A | * | 8/1978 | Yasuda | .................... 337/108 C |
| 5,150,081 A | | 9/1992 | Goldberg | .................... 331/109 |
| 5,872,033 A | | 2/1999 | Figura | ........................ 438/255 |

OTHER PUBLICATIONS

"Circuit Oscillateur a Transistors Mos" published Dec./1973, R.C.A.

* cited by examiner

Primary Examiner—Arnold Kinkead
(74) Attorney, Agent, or Firm—Lisa K. Jorgenson; E. Russell Tarleton; Seed IP Law Group PLLC

(57) ABSTRACT

A low consumption oscillator having an inverter connected to a high supply potential and to a low supply potential via two respective resistors, with the resistors formed of capacitors having strong leakages.

17 Claims, 2 Drawing Sheets

LOW CONSUMPTION OSCILLATOR

TECHNICAL FIELD

The present invention relates to a quartz oscillator using an inverter in CMOS technology, and more specifically to a low consumption oscillator.

BACKGROUND OF THE INVENTION

FIG. 1 shows such an oscillator that includes an inverter 8 formed of a P-channel MOS transistor MP1 and of an N-channel MOS transistor MN1, series connected between a high supply potential Vdd and a low supply potential GND. The gates of transistors MP1 and MN1 are interconnected and form input A of the inverter. Output B of the inverter, which is also the output of the oscillator, is sampled from the drains of transistors MP1 and MN1. A quartz crystal 10 is connected in parallel with a resistor 12 between the input and the output of inverter 8. Further, two capacitors 14 and 16 respectively connect the input and the output of inverter 8 to low supply potential GND.

Such an oscillator consumes a power proportional to the oscillation frequency, this consumption being essentially due to the simultaneous conduction of transistors MP1 and MN1 upon transitions of the output signal.

FIG. 2 shows a solution currently used to reduce the consumption of an oscillator of the type in FIG. 1. Transistors MP1 and MN1, instead of being directly connected to potentials Vdd and GND, are connected to these potentials via respective resistors 18 and 20.

With this configuration, the switching currents of inverter 8 are decreased proportionally to the value of resistors 18 and 20. However, the amplitude of the output signal decreases all the more as resistors 18 and 20 have high values. This amplitude decrease does not affect the oscillator operation, but an amplifier 22 however has to be provided to bring the peak levels of the oscillator's signal back to levels close to the supply potentials to generate an exploitable logic signal.

Accessorily, capacitors 24 and 25 are connected in parallel with resistors 18 and 20, which provides a smoothing of the voltage across transistors MP1 and MN1 and a decrease of the dynamic output impedance of the inverter.

Resistors 18 and 20 can be chosen with particularly high values without affecting the oscillator operation. A problem however is the forming of resistors of high value in an integrated circuit. In an integrated circuit, a resistor is formed of a polysilicon track having a length proportional to the value of the resistor. To form resistors of proper value for a low consumption oscillator of the type in FIG. 2, the polysilicon tracks would take up a non-negligible surface area.

SUMMARY OF THE INVENTION

The disclosed embodiments of the present invention provide an oscillator with a particularly low power consumption that does not require a resistor occupying a significant surface area.

To achieve the foregoing, the disclosed embodiments of the present invention provide a low power consumption oscillator comprising an inverter connected to a high supply potential and to a low supply potential via two respective resistors. The resistors are formed of capacitors with a strong leakage.

According to an embodiment of the present invention, the oscillator output is connected to an amplifier intended to provide logic levels from the output levels of the oscillator.

According to an embodiment of the present invention, the amplifier includes several stages, each including two transistors connected in series between the high and low supply potentials, the gate of a first transistor of each stage being connected to the output of the preceding stage, and the gates of the second transistors of two consecutive stages being respectively connected to the input and to the output of said inverter.

The foregoing features and advantages of the present invention will be discussed in detail in the following non-limiting description of specific embodiments in connection with the accompanying drawings.

DETAILED DESCRIPTION OF THE INVENTION

Figure 1:
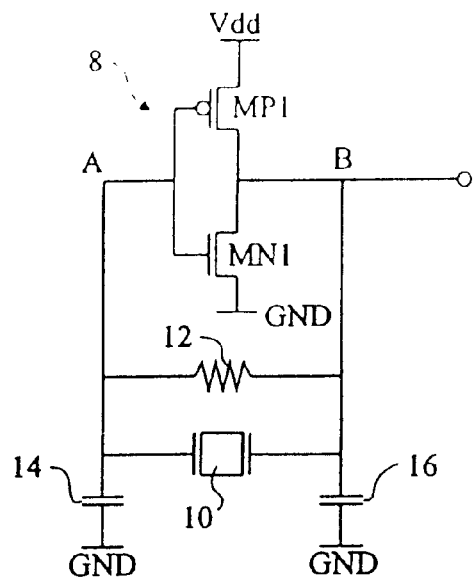
FIG. 1, previously described, shows a conventional quartz oscillator.
Figure 2:
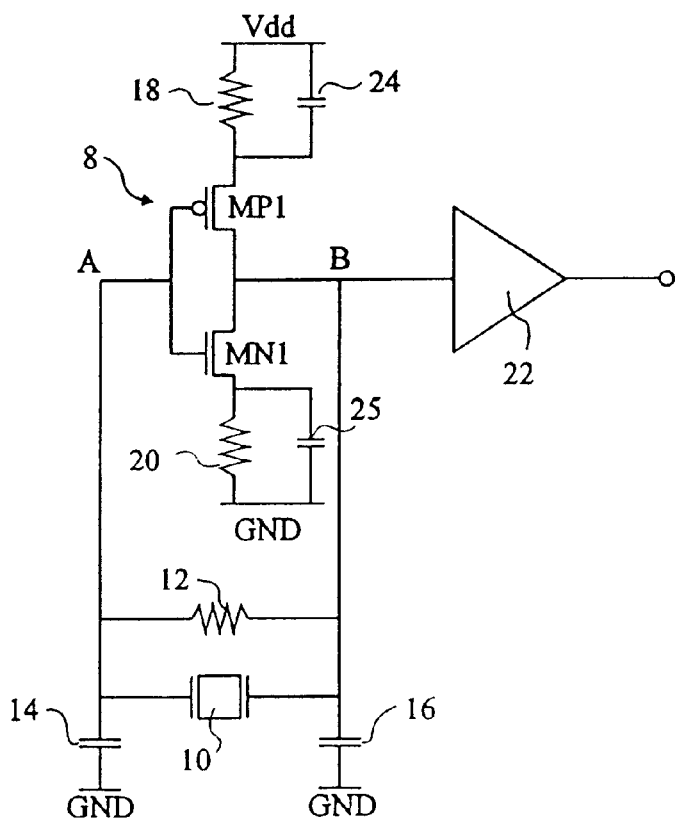
FIG. 2, previously described, shows a conventional low consumption quartz oscillator.
Figure 3:
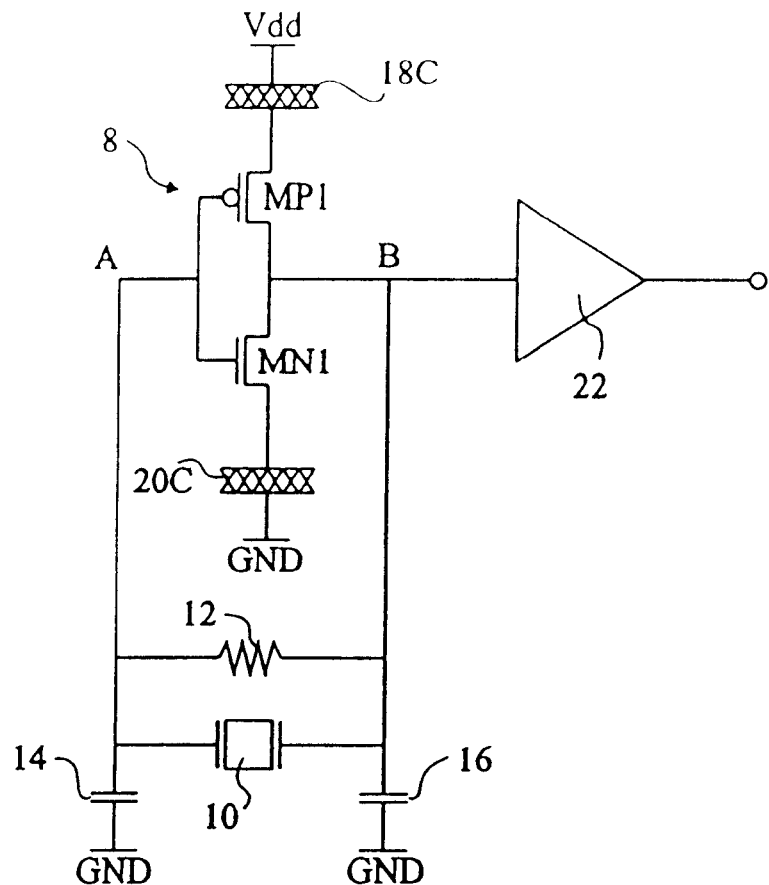
FIG. 3 shows an embodiment of a low consumption quartz oscillator according to the present invention.

Referring to FIG. 3, the same elements as shown in FIGS. 1 and 2 are designated by the same reference numbers. According to the disclosed embodiments of the present invention, resistors 18 and 20 of the oscillator of FIG. 2 have been replaced with capacitors 18C and 20C of a specific type. No other element is provided to connect transistors MP1 and MN1 to supply potentials Vdd and GND.

According to the present invention, capacitors 18C and 20C are formed to have strong leakages with respect to conventional capacitors formed in the same technology. A conventional capacitor typically has a leakage resistance on the order of $10^{12}$ $\Omega/\mu m^2$. This resistance is so high that the oscillator cannot operate. Conversely, capacitors 18C and 20C are, according to the present invention, denatured to have strong leakages, for example, by doping their dielectric with impurities. Leakage resistances on the order of 100 to 1000 M$\Omega$, which enable the oscillator operation, are thus obtained. The exact value of the resistances is of no importance within the above range (it can be controlled to 20–25%). However, the two capacitors must substantially have the same leakage resistance, to have a symmetrical signal. This is easy to guarantee in a same batch of integrated circuits.

The resistances obtained with this solution are much higher than those that can be obtained with conventional methods (smaller than 10 M$\Omega$). Further, the capacitance of capacitors 18C and 20C is of little importance. In particular, the capacitors can be chosen to have the smallest possible size, to occupy a negligible surface.

Capacitors 18C and 20C accessorily perform the function of capacitors 24 and 25 of FIG. 2 and thus may be used as a charge tank.

The amplitude of the output signal of the oscillator of FIG. 3 is particularly small. For example, in an oscillator supplied under 2 V and operating at a 50-MHz frequency with capacitors 18C and 20C having a leakage resistance of 100 M$\Omega$, the output signal has a peak-to-peak amplitude of 300 mV. As for the circuit of FIG. 2, the output signal is provided to an amplifier 22 intended for bringing the amplitude of the signal close to the supply voltage. Amplifier 22 must be able to operate at high frequency while having a low consumption.

Figure 4:
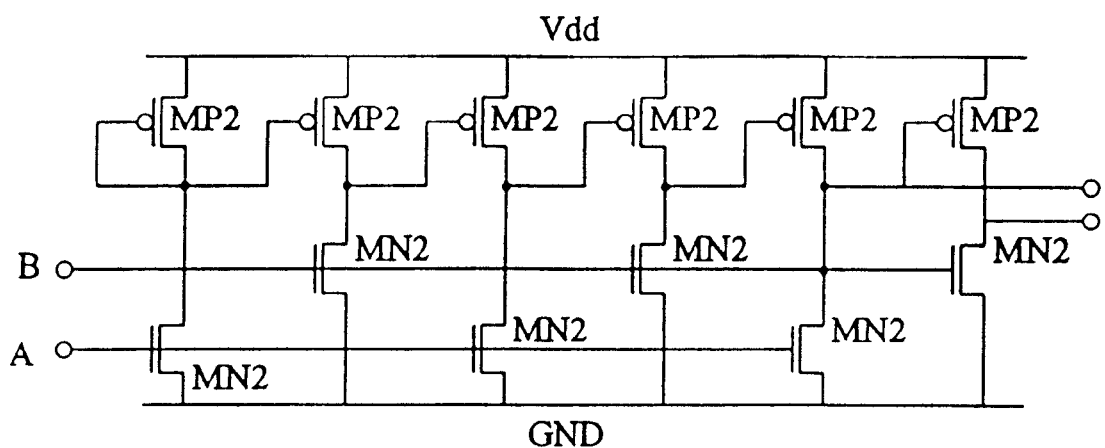
FIG. 4 shows a particularly advantageous example of an amplifier used in the oscillator of FIG. 3.

FIG. 4 shows an example of an amplifier fulfilling these conditions. This amplifier includes a succession of stages, each of which is comprised of a P-channel MOS transistor MP2 and of an N-channel MOS transistor MN2 connected in series between high supply potential Vdd and low supply potential GND. The gate of the transistor MP2 of a stage is connected to the output of the preceding stage, that is, to the drains of transistors MP2 and MN2 of the preceding stage. The gates of the transistors MN2 of two successive stages are respectively connected to input A and to output B of inverter 8 of FIG. 3. The gate of the transistor MP2 of the first stage is connected to the output of this same stage. The amplifier output is sampled from the output of the last stage. It may be differentially sampled from the outputs of the last two stages.

The number of stages of the amplifier determines its gain. The gain is substantially equal to $2^n$, where n is the number of stages.

The quiescent current of each stage can be chosen to be particularly small. It is determined by the size of transistors MP2 and MN2 and the common mode voltage on input terminals A and B, this common mode voltage being half the supply voltage if the leakage resistances of capacitors 18C and 20C are equal.

Of course, the present invention is likely to have various alterations, modifications, and improvements which will readily occur to those skilled in the art. For example, one of the input terminals of the amplifier of FIG. 4, instead of receiving the output or input signal of inverter 8, may receive a constant voltage equal to the common mode voltage.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereof.

What is claimed is:

1. A low power consumption oscillator, comprising: an inverter connected to a high supply potential and to a low supply potential via two respective capacitors, each structured to have a substantially same leakage resistance in the range 100–1000 Mohm/$\mu$m$^2$, and further comprising an amplifier having a succession of stages coupled to the inverter whereby outputs of two last successive stages maybe sampled.

2. The oscillator of claim 1, comprising an output connected to the amplifier structured to provide logic levels from output levels of the oscillator.

3. The oscillator of claim 2 wherein the amplifier includes several stages, each stage having two transistors connected in series between the high and low supply potentials, a gate of a first transistor of each stage connected to an output of a preceding stage, and the gates of the second transistors of two consecutive stages respectively connected to an input and to an output of said inverter.

4. The oscillator of claim 1, further comprising a quartz crystal coupled in parallel to the inverter.

5. The oscillator of claim 4, further comprising a resistive element coupled in parallel with the quartz crystal.

6. The oscillator of claim 5, further comprising a first capacitive element coupled between the low supply potential and an input terminal of the inverter and a second capacitive element coupled between the low supply potential and an output terminal of the inverter.

7. The oscillator of claim 6, wherein the quartz crystal and resistive element each have a first terminal coupled to a node formed by the connection between the first capacitor and the inverter input, and the quartz crystal and resistive element each further have a second terminal coupled to a node formed by the connection between the second capacitor and the inverter output.

8. An oscillator, comprising:
   an inverter having a first supply terminal, a second supply terminal, an input, and an output;
   a first capacitor coupled between the first supply terminal and a high supply potential and a second capacitor coupled between the second supply terminal and a low supply potential, the first and second capacitors each having a substantially same leakage resistance in the range of 100–1000 Mohm/$\mu$m$^2$, and further comprising an amplifier having a succession of stages coupled to the inverter whereby outputs of two last successive stages maybe sampled.

9. The oscillator of claim 8, further comprising a quartz crystal having a first terminal coupled to the inverter input and a second terminal coupled to the inverter output.

10. The oscillator of claim 8, further comprising a resistor coupled in parallel to the inverter input and the inverter output, and a quartz crystal coupled in parallel to the resistor, the quartz crystal having a first terminal coupled to the inverter input and a second terminal coupled to the inverter output.

11. The oscillator of claim 8, further comprising a first capacitive element coupled between the low supply terminal and the inverter input, a second capacitive element coupled between the low supply potential and the inverter output, a resistor coupled in parallel to a quartz crystal, the resistor and the quartz crystal each having a first terminal coupled to the node formed by the connection between the first capacitor and the inverter input, and the quartz crystal and resistive element each further having a second terminal coupled to the node formed by the connection between the second capacitor and the inverter output.

12. The oscillator of claim 11, wherein the amplifier having an input coupled to the inverter output and an output coupled to an oscillator output terminal.

13. The oscillator of claim 12, wherein the amplifier comprises a succession of stages, each stage having a first transistor and a second transistor coupled in series between the high supply potential and the low supply potential, each first transistor of each stage having a gate connected to an output of a preceding stage, and each second transistor having a gate, with the gates of the second transistors of two consecutive stages respectively coupled to the inverter input and the inverter output.

14. An oscillator, comprising:
   an inverter having a first supply terminal, a second supply terminal, an input, and an output;
   a first capacitor coupled between the first supply terminal and a high supply potential and a second capacitor coupled between the second supply terminal and a low supply potential, the first and second capacitors each having a substantially same leakage resistance in the range of 100–1000 Mohm/$\mu$m$^2$;
   a quartz crystal having a first terminal coupled to the inverter input and a second terminal coupled to the inverter output; and
   an amplifier with a succession of stages, having an input coupled to the inverter output, whereby outputs of two last successive stages may be sampled and provided to an output terminal.

15. The oscillator of claim 14, further comprising a resistor coupled in parallel with the quartz crystal, a first capacitive element coupled between the low supply potential and the inverter input, and a second capacitive element coupled between the low supply potential and the inverter output.

16. The oscillator of claim 14, wherein the amplifier comprises a succession of stages, each stage having a first transistor and a second transistor connected in series between the high supply potential and the low supply potential, each first transistor having a gate coupled to an output of a preceding stage, and each second transistor having a gate, the gates of the second transistors of two consecutive stages respectively coupled to the inverter input and the inverter output.

17. The oscillator of claim 14, wherein the first and second capacitors are structured to have a dielectric doped with impurities.

\* \* \* \* \*